United States Patent [19]

Yanagibori

[11] Patent Number: 4,919,640

[45] Date of Patent: Apr. 24, 1990

[54] AUTO TUNING APPARATUS

[75] Inventor: Masami Yanagibori, Chiba, Japan

[73] Assignee: Sony Corporation, Tokyo, Japan

[21] Appl. No.: 247,377

[22] Filed: Sep. 21, 1988

[30] Foreign Application Priority Data

Sep. 22, 1987 [JP] Japan ................... 62-238254

[51] Int. Cl.$^5$ ............... H04B 11/16; H04B 1/26
[52] U.S. Cl. .................. 455/164; 455/165; 455/254; 455/260
[58] Field of Search ........... 455/164, 165, 182, 183, 455/260, 264, 265, 254, 258, 316–318; 331/16, 22, 30, 31

[56] References Cited

U.S. PATENT DOCUMENTS

| | | | |
|---|---|---|---|
| 4,355,414 | 10/1982 | Inoue . | |
| 4,392,253 | 7/1983 | Yamada et al. | 455/165 |
| 4,461,035 | 7/1984 | Sakamoto | 455/164 |
| 4,727,591 | 2/1988 | Manlove | 455/164 |

FOREIGN PATENT DOCUMENTS 5683122 7/1979 Japan .
2040622 1/1980 United Kingdom .

Primary Examiner—Reinhard J. Eisenzopf
Assistant Examiner—Curtis Kuntz
Attorney, Agent, or Firm—Lewis H. Eslinger; Jay H. Maioli

[57] ABSTRACT

An auto tuning apparatus sequentially varies the value of N, a positive integer, in the frequency-dividing ratio 1/N of a variable frequency-dividing circuit incorporated in a local oscillating circuit having a phase locked loop configuration. The apparatus detects a plurality of candidate tuning points of an intermediate frequency carrier and includes a circuit for performing a scan of those tuning points by, among other steps, changing a tuning point detecting threshold relative to the level of the received signal. A circuit is provided for determining the correct or optimum tuning point on the basis of the scan.

4 Claims, 6 Drawing Sheets

AUTO TUNING APPARATUS

BACKGROUND OF THE INVENTION

1. Field of the Invention

This invention relates generally to auto tuning apparatus and more particularly to an auto tuning apparatus for use with a synthesizer tuner.

2. Description of the Prior Art

When automatically scanning tuning points using a so-called synthesizer tuner, a scan button, for example, in the synthesizer tuner is depressed. Then, the value of N, a positive integer, in a frequency-dividing ratio 1/N of a variable frequency-dividing circuit in a local oscillating circuit of the synthesizer tuner is varied to change the local oscillation frequency, so that the received frequency is changed. When a tuning point, i.e., a receiving frequency coinciding with the frequency of a wave broadcast from a given station, is detected, the changing of the value of N is stopped, thus stopping the scan and enabling the synthesizer tuner to receive a program of that broadcast station.

In this case, the tuning point, i.e., the receiving frequency coinciding with the frequency of the broadcast wave, is discriminated by detecting the intermediate frequency carrier.

For example, an intermediate frequency amplifying circuit rectifies an intermediate frequency carrier component derived from an intermediate frequency filter to produce a DC voltage. When the DC voltage exceeds a threshold level, that tuning point is detected as a correct or optimum tuning point, i.e., the receiving frequency coinciding with the frequency of the broadcast wave.

Various methods are known for detecting an intermediate frequency carrier: A method involving A/D (analog-to-digital) conversion of the rectified output; a method involving detection of a carrier frequency by using a counter; a method involving frequency-discrimination of a carrier frequency to detect it as the central value of its S-shaped characteristic; and so on.

In other cases, including the present case, the value of N is varied with a frequency interval corresponding to the precision with which the tuning point is to be detected. Generally, the value of N is varied in such a fashion that an FM tuner for, for example, the Japanese market can check the received signal at a frequency interval of 100 kHz, while an FM tuner for the European market or the like can check the received signal at a frequency interval of 50 kHz.

The preceding examples apply particularly to an FM tuner. In an AM tuner, the value of N is changed to provide detection at a frequency interval of, for example, 9 kHz.

There is a time delay when the tuning point, i.e., the receiving frequency coinciding with the frequency of a broadcast wave, is detected in a conventional manner by detecting an intermediate frequency carrier (this technique is disclosed in U.S. Pat. No. 4,298,989). As a result, when the scanning speed is too high, the detection of the tuning point cannot accurately follow the scan. Consequently, in most cases, the scan is stopped at a value of N that is one step beyond the value of N that gives the optimum or correct tuning point. In such cases, therefore, the correct or optimum tuning point can be obtained only by returning the value of N to a previous value (generally one step previous).

The frequency interval mentioned above, which corresponds to steps of varying the value of N, is narrower than the width of the passband of the intermediate frequency filter employed. Therefore, there may occur the case that, within the width of the passband of the intermediate frequency filter, there are contained a plurality of values of N, e.g., three such values NA, NO and NB, as shown in FIG. 1.

Thus, particularly when the received electric field intensity is high, there is a risk that, although the correct tuning point corresponds to an N-value of NO in FIG. 1, NA or NB respectively before and after NO will be falsely detected as the optimum or correct tuning point for the broadcast wave.

In such a case, it is sufficient that the width of the passband of the intermediate frequency filter be selected to encompass an odd number of values such as three and that the central value, i.e., the middle tuning point in the odd number of tuning points, be selected as the correct tuning point.

This method is, however, possible only on the condition that the intermediate frequency filter has a bandpass characteristic that is symmetrical with respect to its intermediate frequency.

A commercial band-pass filter, which is mass-produced, is not always free from the displacement of its center passband frequency. In other words, it often lacks symmetry with respect to an intermediate frequency. With the above-mentioned band-pass filter, there can occur a case such that an even number of potential tuning points, such as two or four, exist within the passband, with the result that a central tuning point cannot be identified, thus making it impossible in conventional practice to determine the correct or optimum tuning point.

Even if the intermediate frequency filter can initially maintain the symmetrical property described above, the sideband component is varied depending on the contents of the received signal, thus sometimes resulting in an even number of tuning points. Further, a filter with a wide band characteristic where more than five values of N are contained within its intermediate filter band characteristic is poor in selectivity. It is therefore customary to avoid the use of such a filter. The shortcomings described above cannot be avoided by the apparatus of the prior art.

OBJECTS AND SUMMARY OF THE INVENTION

It is an object of the present invention to provide an improved auto tuning apparatus that avoids the shortcomings of the prior art described above.

Another object of the present invention is to provide an auto tuning apparatus that can identify a correct tuning point as accurately as possible regardless of the number of values of N contained within the intermediate frequency filter characteristic of the band-pass filter employed.

More particularly, an object of the invention is to provide an auto tuning apparatus that functions correctly in all cases, including cases where the number of values of N within the passband is even and cases where a relatively large number of such values lie within the passband.

According to one aspect of the present invention, there is provided an auto tuning apparatus for automatically determining a correct tuning point of an intermediate frequency carrier of a received signal, the apparatus comprising: a local oscillating circuit having a phase locked loop configuration and including a variable frequency-dividing circuit having a frequency dividing ratio 1/N, where N is a positive integer, and means for sequentially varying the value of N; detecting means for detecting a plurality of tuning points of the intermediate frequency carrier; scanning means responsive to the detecting means for carrying out a scan of the plurality of tuning points by varying a tuning point detecting threshold value relative to a level of the received signal; and means responsive to the scanning means for determining the correct tuning point.

According to another aspect of the present invention, there is provided an auto tuning apparatus for automatically determining a correct tuning point of an intermediate frequency carrier of a received signal, the apparatus comprising: a local oscillating circuit having a phase locked loop configuration and including a variable frequency-dividing circuit having a frequency dividing ratio 1/N, where N is a positive integer, and means for sequentially varying the value of N; detecting means for detecting a plurality of tuning points of the intermediate frequency carrier; scanning and sensitivity changing means responsive to the detecting means for carrying out a scan of the plurality of tuning points and changing a receiving sensitivity relative to the level of the received signal; and means responsive to the scanning and sensitivity changing means for determining the correct tuning point.

The foregoing and other objects, features and advantages of the present invention will become apparent from the following detailed description of the preferred embodiment to be taken in conjunction with the accompanying drawings, throughout which like reference numerals identify like elements and parts.

DESCRIPTION OF THE PREFERRED EMBODIMENT

An embodiment of an auto tuning apparatus according to the present invention will now be described with reference to the drawings.

Figure 2:
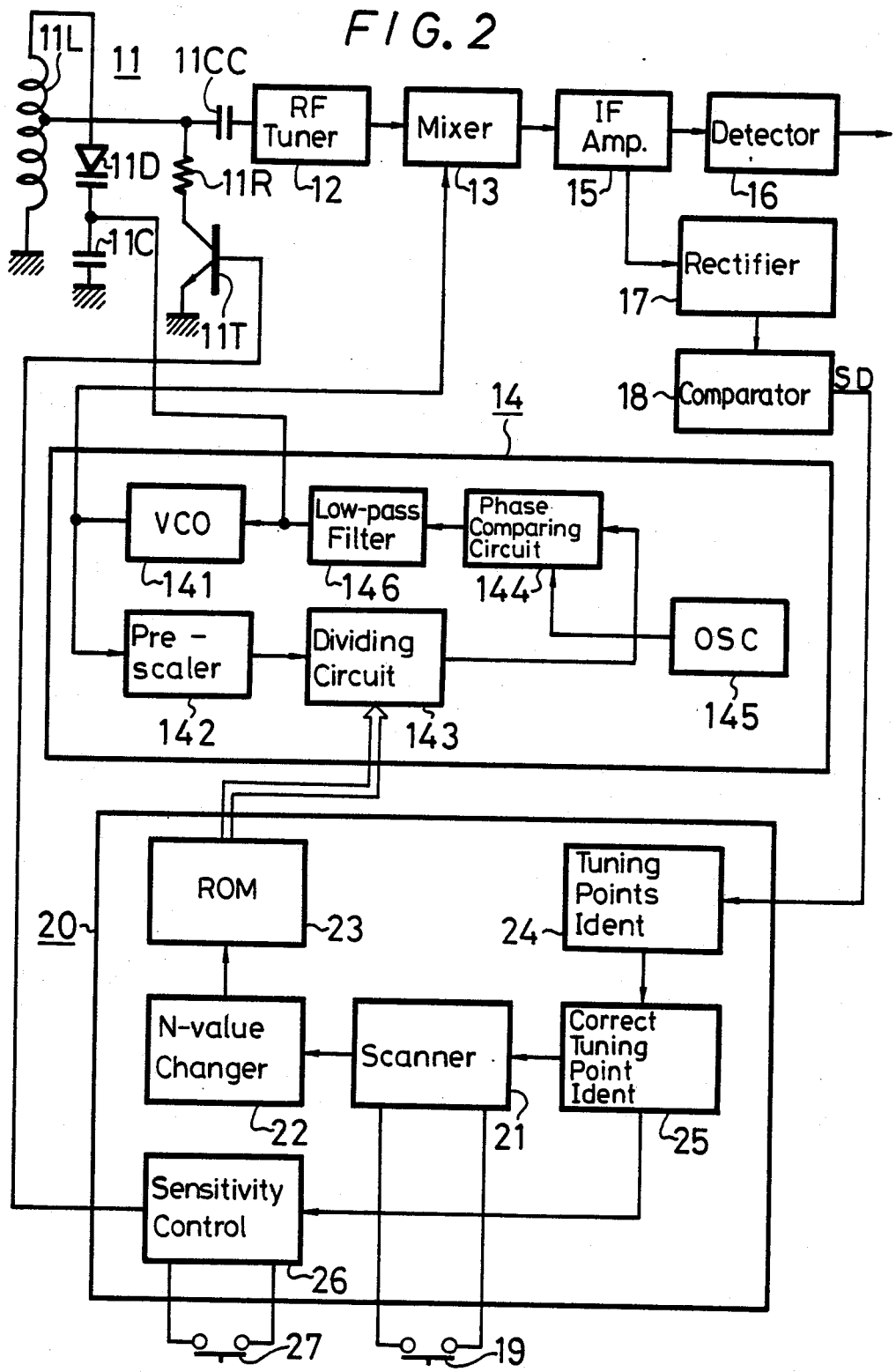
FIG. 2 is a block diagram showing an embodiment of an auto tuning apparatus according to the present invention.

FIG. 2 illustrates a circuit arrangement of a synthesizer tuner of, for example, an AM radio receiver to which the present invention is applied.

As FIG. 2 shows, there is provided an antenna tuning circuit 11 which comprises an antenna tuning coil 11L, a varactor diode 11D and a capacitor 11C. A high or radio frequency signal from the antenna tuning circuit 11 is supplied through a high or radio frequency tuning circuit 12 including a coupling capacitor 11CC to a mixer 13, in which it is mixed with a local oscillation signal from a local oscillating circuit 14. By this means the carrier frequency is converted to an intermediate frequency. The output from the mixer 13 is supplied to an intermediate frequency amplifying circuit 15 that includes an intermediate frequency filter. The intermediate frequency amplifying circuit 15 produces an amplified intermediate frequency signal that is supplied to a detecting circuit 16 and is thereby AM-detected. The detected output from the detecting circuit 16 is supplied through, for example, a power amplifier to a loudspeaker, though not shown.

The local oscillating circuit 14 has a phase locked loop (PLL) configuration that includes a voltage-controlled, variable-frequency oscillating circuit (VCO) 141, a pre-scaler 142, a variable frequency-dividing circuit 143, a phase comparing circuit 144, a reference oscillating circuit (OSC) 145, and a low-pass filter 146. The oscillating signal from the variable-frequency oscillating circuit 141 is supplied to the mixer 13 as the local oscillation signal. This oscillation signal is also supplied to the pre-scaler 142, in which it is frequency-divided in advance by a constant and then fed to the variable frequency-dividing circuit 143. A positive integer N for use in establishing the frequency-dividing ratio 1/N of this variable frequency-dividing circuit 143 is supplied from a channel-selection control means 20 that employs a microcomputer. The output from the variable frequency-dividing ircuit 143 is supplied to the phase comparing circuit 144, in which it is phase-compared with a reference signal from the reference oscillating circuit 145. The compared output is supplied through the low-pass filter 146 to the VCO 141, whereby the VCO 141 is controlled so that its oscillation frequency is responsive to the frequency-dividing ratio 1/N. A voltage that corresponds to the output frequency of the VCO 141 and is derived from the low-pass filter 146 is supplied to the varactor diode 11D in the antenna tuning circuit 11.

The channel-selection control means 20 helps to implement the automatic tuning function as follows.

The channel-selection control means 20 comprises scan means 21 that starts its driving operation when a scan button 19 is depressed, N-value changing means 22 that is driven by the scan means 21, and N-value supplying means 23 that is operated by the N-value changing means 22 to supply the appropriate values of N to the variable frequency-dividing circuit 143. The N-value supplying means 23 is formed of ROM (read only memory) that stores enough values of N to enable reception of broadcast signals with a frequency interval of 9 kHz within the AM band (in this example). The N-value changing means 22 comprises read address means for reading data from the ROM 23 and control means for controlling the ROM 23.

When the scan button 19 is depressed, the N-value changing means 22 is driven by the scan means 21 so that values of N are sequentially read out from the N-value supplying means 23 and supplied to the variable frequency-divider circuit 143. In practice, the scan button 19 comprises two push-button switches: i.e., an up-button and a down-button, though not shown. When the up-button is depressed, values of N for producing local oscillation signals that increase the receiving frequency in steps of 9 kHz each are sequentially read out from the N-value supplying means or ROM 23. When on the other hand the down-button is depressed, values of N for producing local oscillation signals that decrease the receiving frequency in steps of 9 kHz each are sequentially read out from the N-value supplying means or ROM 23.

As described above, the receiving frequency for the broadcast wave is scanned: in other words, the tuning point is scanned. In this case, data indicating whether or not there exists a broadcast wave is fed back to the channel-selection control means 20 to perform the tuning operation as follows.

The intermediate frequency carrier component from the intermediate frequency amplifier circuit 15 is supplied to a carrier rectifying circuit 17, in which it is rectified to assume a DC level. This DC output is supplied to a level comparing circuit 18, in which it is compared with a predetermined threshold level. The comparing circuit 18 produces an output signal SD which assumes, for example, a low level when the DC output exceeds the threshold level. It is determined on the basis of this output signal SD that a broadcast wave is being received and hence that there exists a tuning point.

Figure 1:
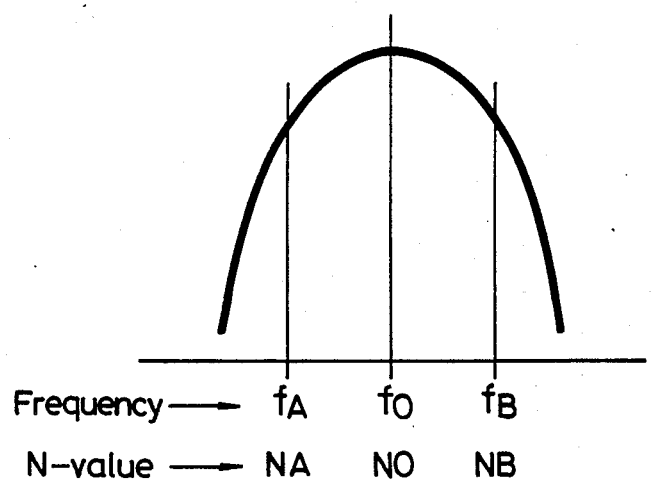
FIG. 1 is a graph illustrating a filter characteristic of an intermediate frequency filter.
Figure 3:
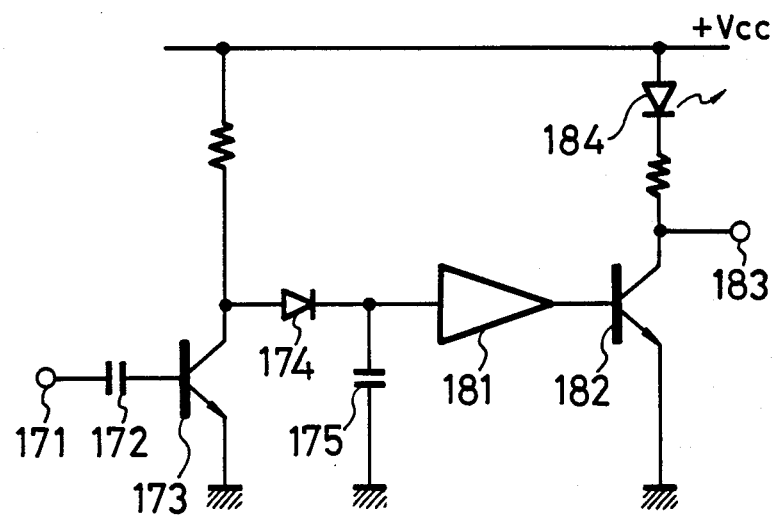
FIG. 3 is a diagram showing an example of circuitry forming a part of the auto tuning apparatus of FIG. 1.

FIG. 3 is a diagram showing an example of the carrier rectifying circuit 17 and the level comparing circuit 18 of FIG. 2.

In FIG. 3, the intermediate frequency carrier component from the intermediate frequency amplifying circuit 15 (FIG. 2) is supplied to a terminal 171. This intermediate frequency carrier component is then supplied through a capacitor 172 to the base of a transistor 173 which is used to amplify the intermediate frequency carrier. The intermediate frequency carrier developed at the collector of the transistor 173 is rectified by a diode 174 and a capacitor 175. The rectified output therefrom is supplied through an amplifier 181 to the base of a transistor 182 that forms a comparator. At the tuning point, since the amplitude of the intermediate frequency carrier is high and the rectified output is large, the transistor 182 is turned on. Thus, at an output terminal 183 there appears the output signal SD (FIG. 2) whose level is changed from high to low when the intermediate frequency carrier is detected. When the transistor 182 is turned on, a light-emitting diode 184 lights up, making it possible for the user to visually confirm the existence of the tuning point for the broadcast wave in question.

In FIG. 2, the output signal SD from the level comparing circuit 18 is supplied to tuning points identifying means 24 in the channel-selection control means 20. This tuning points identifying means 24 determines whether or not a tuning point has been found by deciding whether or not the output signal SD has gone to a low level. The tuning points identifying means 24 supplies its identified result to correct point identifying means 25. The correct point identifying means 25 supplies a control signal to the scan means 21, which then supplies an N-value changing signal to the N-value changing means 22, thus determining the correct tuning point.

When because of the filter characteristic of the intermediate frequency amplifier circuit 15 two or more values of N are detected as tuning points, the receiving conditions of values of N around the tuning points are checked (whether or not they are tuning points) by switching the receiving sensitivity, thereby to determine the position of the correct tuning point. To this end, when the output from the tuning points identifying means 24 indicates that two successive values of N correspond to tuning points, the correct point identifying means 25 supplies a control signal to a sensitivity control or switching means 26. The output from the sensitivity switching means 26 is supplied to the base of a switching transistor 11T in the antenna tuning circuit 11, thus controlling the transistor 11T to turn on or off.

The collector-emitter path of the transistor 11T is connected to a resistor 11R in series, and this series circuit is connected between an intermediate point of the antenna tuning coil 11L and ground. When the transistor 11T is turned on, the receiving sensitivity is decreased so that it is lower than that resulting when the transistor 11T is turned off. To make the explanation simple, DX (distance) assumes the condition that the receiving sensitivity is high and LOCAL assumes the condition that it is low. Generally, the receiving sensitivity is set in the DX condition and hence the transistor 11T stays off. Reference numeral 27 denotes a sensitivity changeover switch that can be of non-lock construction and is connected to the sensitivity switching means 26. By this switch 27, the DX and LOCAL conditions may be changed over manually. Each time the switch 27 is actuated, the output from the sensitivity switching means 26 is supplied to the base of the transistor 11T or the supply of this output to the base of the tansistor 11T is interrupted. The indication of the DX condition or LOCAL condition may be performed by turning on or off a light-emitting diode, though not shown.

Figure 4:
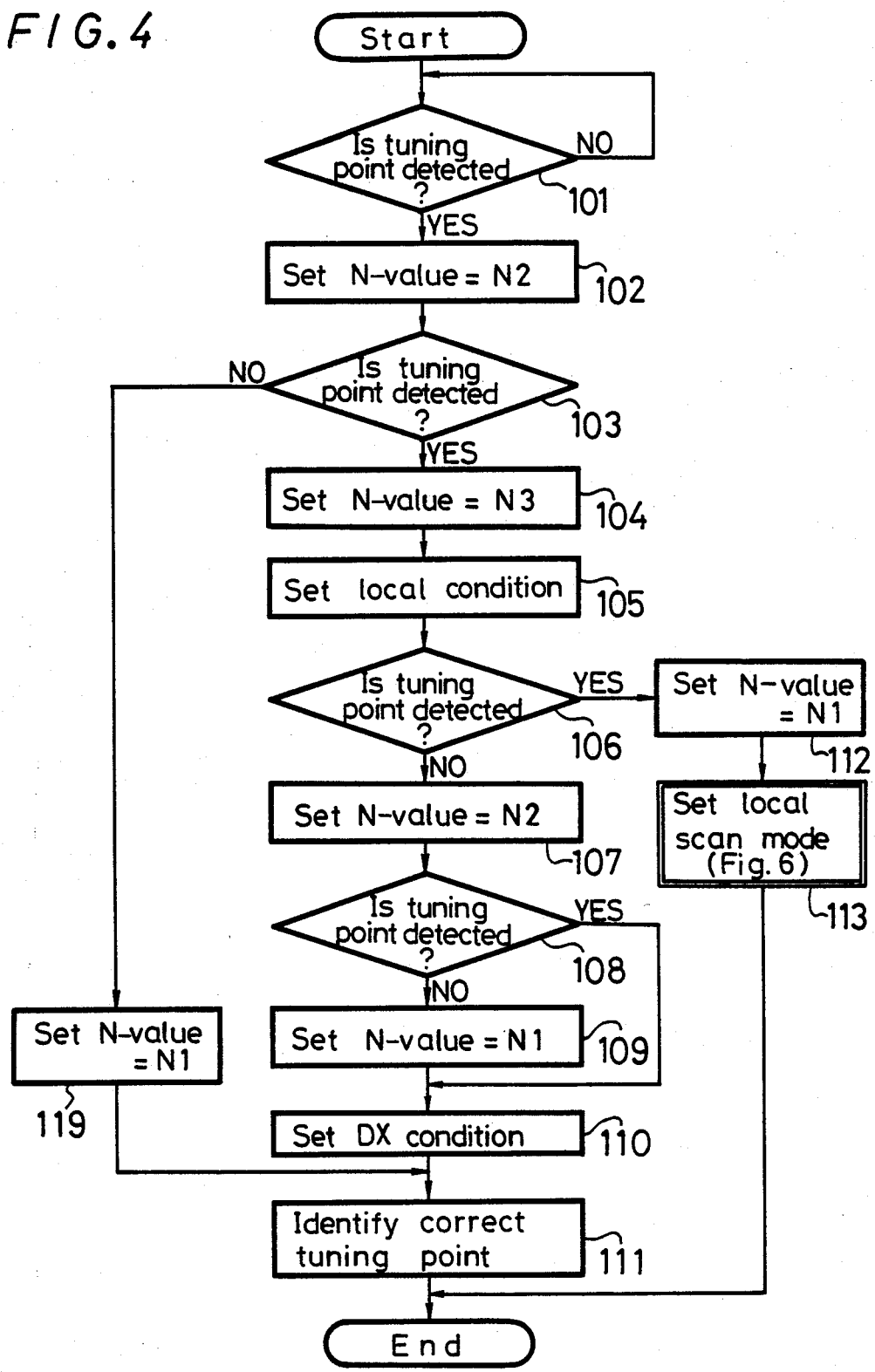
FIGS. 4, 6 and 8 are, respectively, flow charts to which reference will be made in explaining the operation of the auto tuning apparatus of the present invention.
Figure 5:
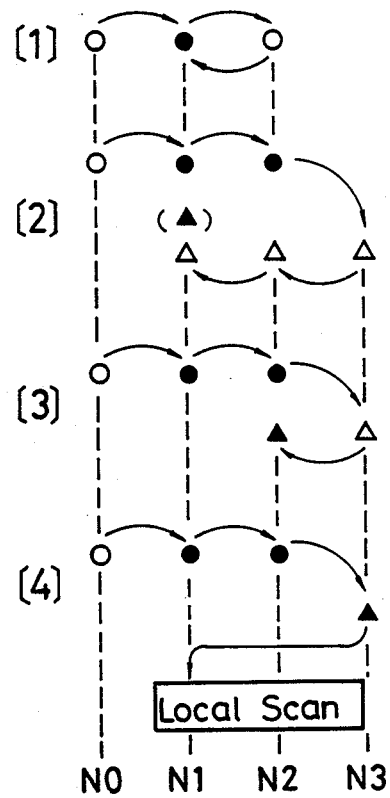
FIGS. 5, 7 and 9 are, respectively, illustrations used to explain how to determine the correct tuning point in accordance with the invention when input signals of various levels are received.
Figure 7:
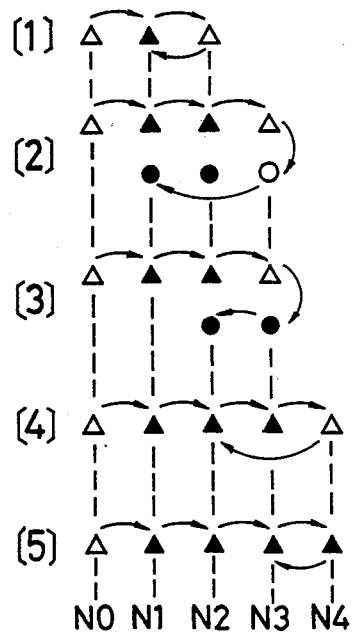
Figure 6:
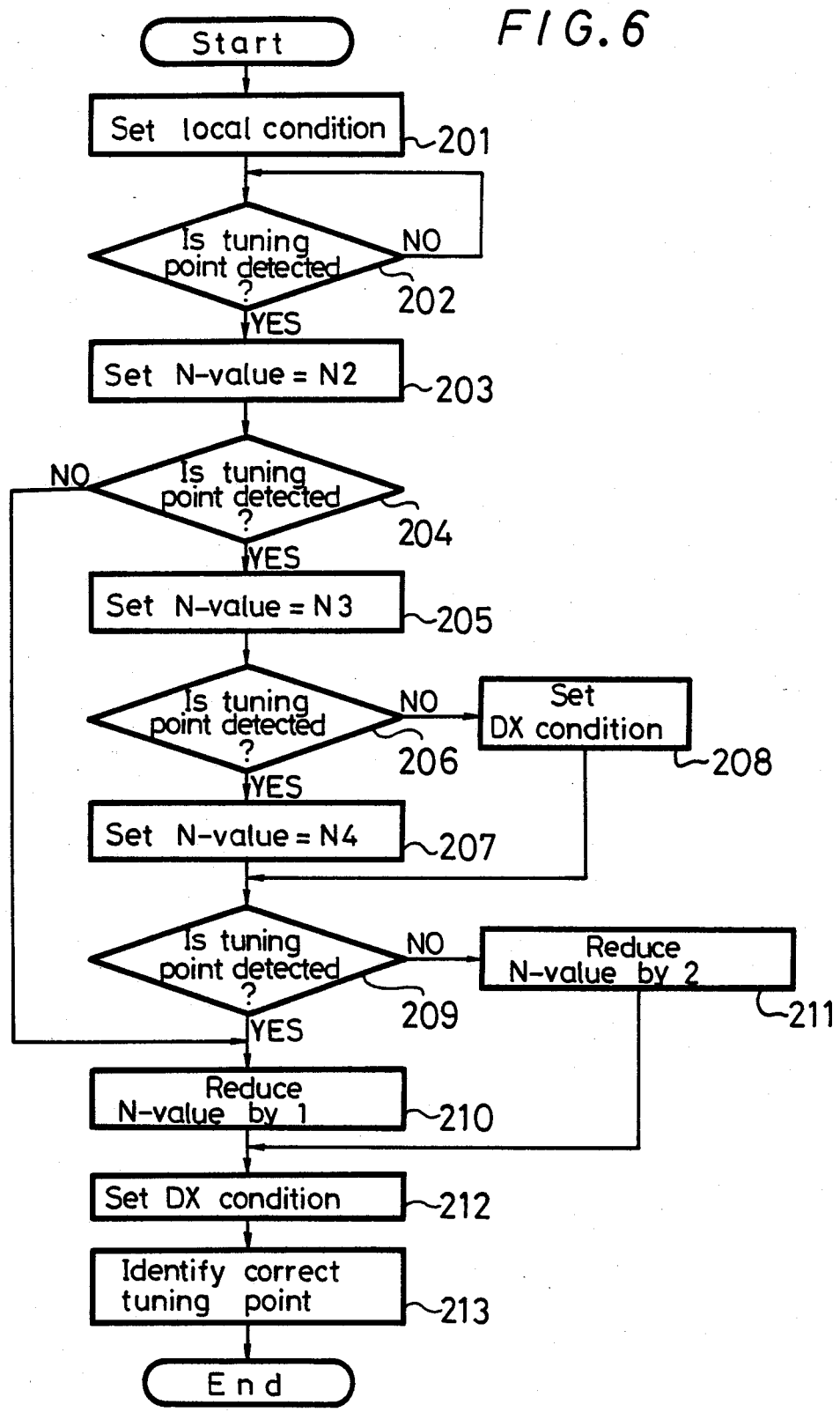

FIGS. 4 and 6 illustrate flow charts to which reference is made in explaining how to determine the correct tuning point when the receiving sensitivity is switched as described above. When the channel-selection control means 20 is realized by a microcomputer, this microcomputer executes the programs of the above-mentioned flow charts forming FIGS. 4 and 6. In practice, the microcomputer can be of an MPD-1715 series manufactured by Nippon Electric Co., Ltd. FIGS. 5 and 7 are diagrams used to illustrate the position of the correct tuning point determined in accordance with the flow charts of FIGS. 4 and 6. In FIGS. 5 and 7, a solid circle represents a tuning point in the DX condition (normal scan mode), an open circle represents a non-tuning point in the DX condition, a solid triangle represents a tuning point in the LOCAL condition (LOCAL scan mode), and an open triangle represents a non-tuning point in the LOCAL condition.

The normal scan mode will be described first with reference to FIGS. 4 and 5.

First, a tuning point is searched for by changing the value of N one step at a time. This searching operation is carried out in the tuning point identifying means 24 by detecting the level of the output signal SD (FIG. 2) from the level comparing circuit 18, as represented at decision step 101. Step 101 is repeatedly executed each time the value of N is varied by on step.

Let it be assumed that the receiving sensitivity is in the DX condition. Finally, a tuning point is detected at an N-value arbitrarily identified as N1 in FIG. 5. When this occurs, as represented by a YES at decision step 101 in FIG. 4, N-value =N1 is changed to N-value =N2 that is advanced in the scan direction by one step as represented at step 102. It is determined by identifying the output SD at decision step 103 whether or not N-value =N2 is a tuning point. If N2 is not a tuning point, as represented by a NO at step 103, the N-value is returned to the initial N-value =N1 of the tuning point at step 119. Then, N-value =N1 is determined to be the correct tuning point at step 111. The above-mentioned tuning operation is performed in case [1]in FIG. 5.

If it is determined as represented by a YES at decision step 103 that the N-value =N2 is a tuning point, or if a plurality of tuning points are detected successively, the routine goes to step 104. At step 104, the N-value is advanced by one step to provide N-value = N3. Then, the sensitivity switching means 26 (FIG. 2) produces a LOCAL signal, turning on the transistor 11T in the antenna tuning circuit 11. Thus the receiving sensitivity is set in the LOCAL condition at step 105. It is determined at decision step 106 whether or not the point of N-value = N3 is a tuning point. If it is not a tuning point, as represented by a NO at step 106, the N-value is returned by one step to provide N-value = N2 at step 107. The routine then goes to the next decision step 108. It is determined at step 108 whether or not the point N2 is a tuning point. If N2 is not a tuning point, as represented by a NO at step 108, the routine goes to step 109. At step 109, the N-value is further returned by one step to provide N value = N1. Then, whether or not N1 is a tuning point, the sensitivity switching means 26 produces the DX signal, turning the transistor 11T off. Thus the receiving sensitivity is set in the DX condition at step 110. Then, N-value = N1 is determined as the correct tuning point at step 111. The above-mentioned tuning operation is performed in case [2] in FIG. 5.

If on the other hand it is determined as represented by a YES at decision step 108 that N-value = N2 is a tuning point, the routine bypasses step 109 and goes directly to step 110. At step 110, the receiving sensitivity is set in the DX condition, and N-value = N2 is determined to be the correct tuning point at step 111. The above-mentioned tuning operation is performed in case [3] in FIG. 5.

As indicated above, it is determined at decision step 106 whether or not N-value = N3 is a tuning point after the receiving sensitivity is switched to the LOCAL condition. If it is determined as represented by a YES at step 106 that N-value = N3 is a tuning point, the N-value is reduced by two steps to provide N-value = N1 at step 112. The routine then enters the LOCAL scan mode at step 113 as will be described next.

The operation of the LOCAL scan mode is set out with reference to a flow chart constituting FIG. 6 and a schematic representation constituting FIG. 7.

The LOCAL scan mode operation is executed as a result of searching step 113 of FIG. 4, as explained above. Alternatively, it is executed independently of the flow chart of FIG. 4 if the receiving sensitivity is manually set in the LOCAL condition by the non-lock type switch 27 (FIG. 2).

In FIG. 6, the receiving sensitivity is switched to the LOCAL condition at step 201. Then, it is determined at the next decision step 202 whether or not a tuning point has been detected. Step 202 is executed again each time the N-value is changed by one step. When a tuning point identified as N1 in FIG. 7 is finally detected, as represented by a YES at step 202, the N-value is advanced by one step to N2 at step 203. When the routine enters the LOCAL scan mode of FIG. 6 because of execution of step 113 of FIG. 4, the scanning operation begins with a point of N-value = N1. If the point of N-value = N1 is determined to be a tuning point, N1 is changed to provide N-value = N2.

Then, it is determined at decision step 204 whether or not the N-value = N2 is a tuning point. If it is not a tuning point, as represented by a NO at step 204, the routine goes to step 210. At step 210, the N-value is reduced by one step to provide N-value = N1. After the receiving sensitivity is switched to the DX condition at step 212, the N-value = N1 is determined to be the correct tuning point at step 213. The above-mentioned tuning operation is performed in case [1] of FIG. 7.

If it is determined as represented by a YES at step 204 that N = N2 is a tuning point, the routine goes to step 205, where the N-value is advanced by one step to provide N-value = N3. It is determined at the next decision step 206 whether or not the point N = N3 is a tuning point. If it is not a tuning point, as represented by a NO at step 206, the receiving sensitivity is switched to the DX condition at step 208. Then the routine goes to the next decision step 209. At step 209, it is determined whether or not the point of N-value = N3 is a tuning point. If it is not a tuning point, as represented by a NO at step 209, the N-value is reduced by two steps to provide N-value = N1 at step 211. Then the routine goes to steps 212 and 213. At step 213, N-value = N1 is determined as the correct tuning point. The above-mentioned tuning operation is performed in case [2] of FIG. 7.

If it is determined as represented by a YES at decision step 209 that the point N3 is a tuning point in the DX condition set at step 208, the N-value is reduced by one step to provide N-value = N2 at step 210. Then the routine goes to steps 212 and 213. At step 213, the N-value = N2 is determined to be the correct tuning point. The above-mentioned tuning operation is performed in case [3] of FIG. 7.

On the other hand, if it is determined as represented by a YES at decision step 206 that the N-value = N3 is a tuning point in the LOCAL condition, the N-value is advanced by one step to provide N-value = N4 at step 207. It is determined at the next decision step 209 whether or not N4 is a tuning point. If N4 is not a tuning point, as represented by a NO at decision step 209, the routine goes to step 211, where the N-value is reduced by two steps to provide N-value = N2. The routine then goes to steps 212 and 213. At step 213, the N-value = N2 is determined to be the correct tuning point. The above-mentioned tuning operation is performed in case [4] of FIG. 7.

At decision step 209, as indicated above, it is determined whether or not N-value = N4 is a tuning point in the LOCAL condition. If N4 is determined to be a tuning point at step 209, the routine goes to step 210, where the N-value is reduced by one step to provide N-value = N3. The routine then goes to steps 212 and 213. At step 212, the receiving sensitivity is switched to the DX condition, and the point of N-value = N3 is determined to be the correct tuning point at step 213 The above-mentioned tuning operation is performed in case [5] of FIG. 7.

In this way, the correct tuning point can be identified under any contingency.

Figure 9:
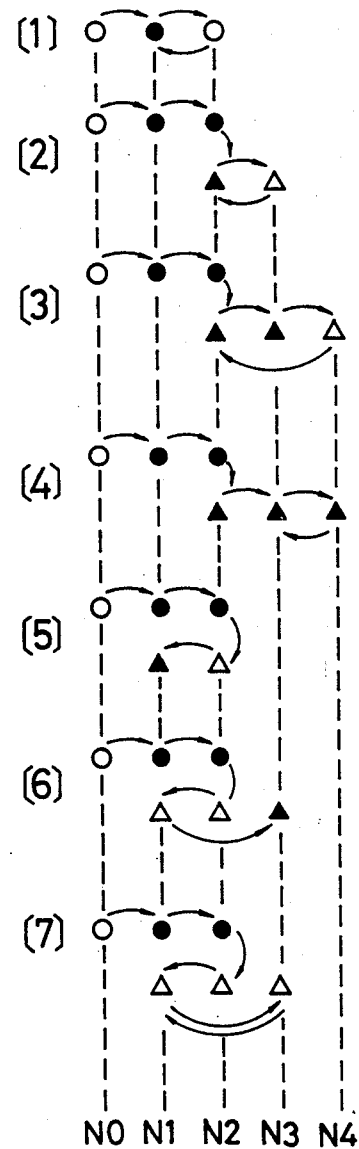

The correct tuning point can of course be identified in accordance with methods (flow charts) different from the flow charts that are described above by way of example. An example of another method is described below with reference to the flow chart of FIG. 8 and the explanatory representation of FIG. 9. In this case, in contrast to the representation of FIG. 2, the manual sensitivity changeover switch 27 is not connected to the sensitivity switching means 26, or at any rate is not used. Also, the receiving sensitivity is normally set in the DX condition and the transistor 11T stays off.

Figure 8:
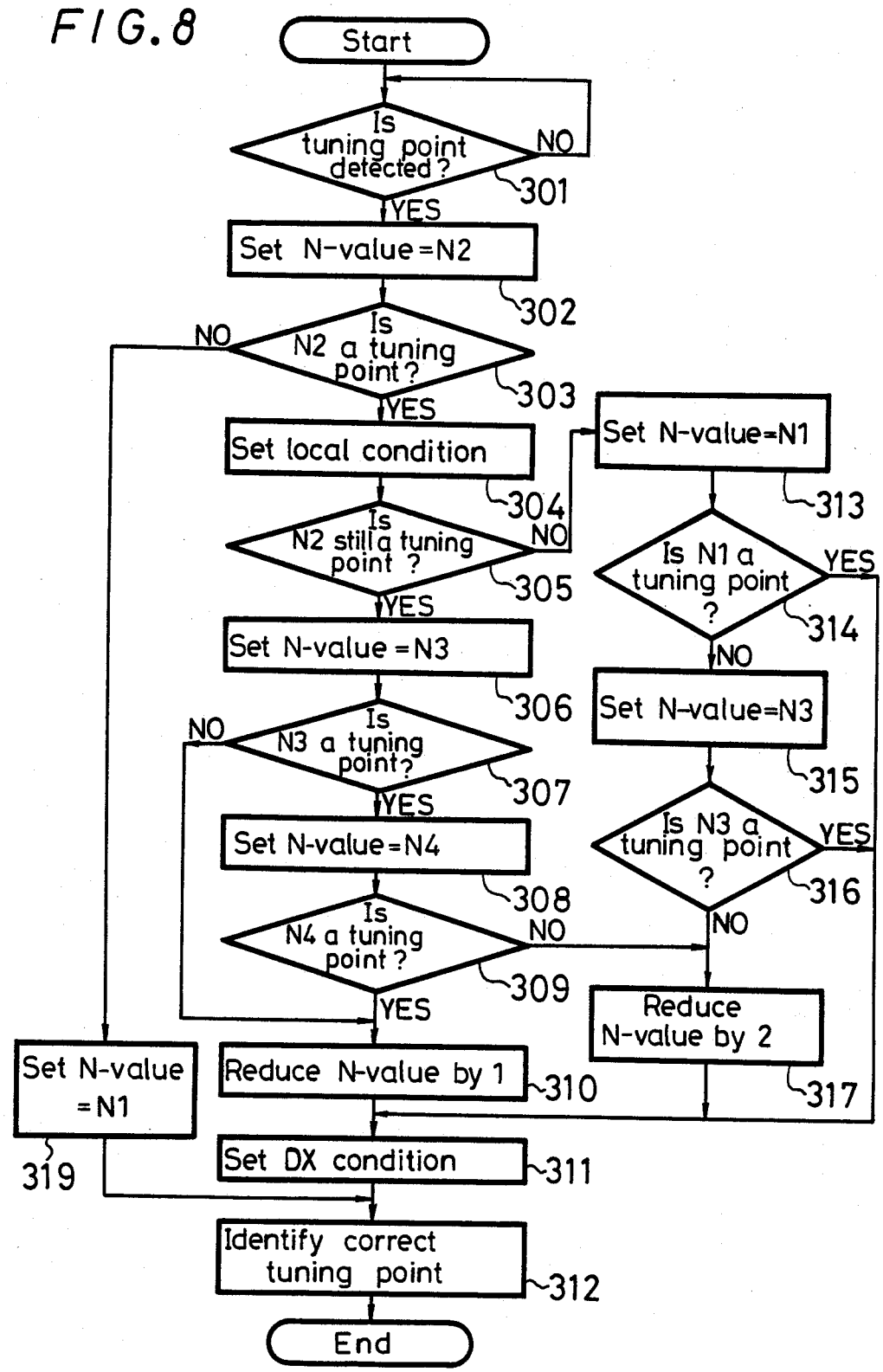

In FIG. 8, the scanning operation begins and the routine goes to decision step 301, where it cycles until a tuning point is detected. When the initial tuning point N1 is finally detected, as represented by a YES at step 301, the routine goes to step 302. At step 302, N1 is advanced by one step to provide N-value =N2. It is then determined at the next decision step 303 whether or not N2 is a tuning point. If N2 is not a tuning point, as represented by a NO at step 303, the routine goes to step 319. At step 319, the N-value is reduced by one step to provide N-value =N1, and then the N-value =N1 is determined to be the correct tuning point at step 312. This tuning operation is performed in case [1]in FIG. 9.

If it is determined at step 303 that N2 is a tuning point as a result of the fact that the N-value is advanced by one step at step 302 the routine goes to step 304, in which the receiving sensitivity is set to the LOCAL condition. Thereafter, it is determined whether or not N2 is still a tuning point (step 305). If at step 305 it is determined that N2 is still a tuning point, the routine goes to step 306, where the N-value is advanced by one step to provide N-value =N3. Then it is determined whether or not N3 is a tuning point (step 307).

If N3 is not a tuning point, as represented by a NO at step 307, the routine goes to step 310, where the N-value is reduced by one step to provide N-value =N2. Then the routine goes to step 311, where the receiving sensitivity is switched to the DX condition. The routine then goes to step 312, where N2 is determined to be the correct tuning point. This tuning operation is performed in case [2]in FIG. 9.

If on the other hand N3 is determined to be a tuning point at step 307, the routine goes to step 308, in which the N-value is advanced by one step to provide N-value =N4. The routine then goes to the next decision step 309. It is determined at step 309 whether or not N4 is a tuning point. If N4 is not a tuning point, as represented by a NO at step 309, the routine then goes to step 317, where the N-value is returned by two steps to provide N-value =N2, and the routine then goes to step 311. At step 311, the receiving sensitivity is switched to the DX condition, and then at step 312 N-value =N2 is determined to be the correct tuning point. This tuning operation is performed in case [3]in FIG. 9.

If N4 is identified as a tuning point at step 309 the routine goes to step 310, where the N-value is reduced by one to provide N-value =N3. Then the routine goes to step 311, where the receiving sensitivity is switched to the DX condition. Thereafter, at step 312, N-value =N3 is determined to be the correct tuning point. This tuning operation is performed in case [4]in FIG. 9.

It is determined at decision step 305 whether or not N2 is still a tuning point after the receiving sensitivity is switched to the LOCAL condition. If N2 is not then a tuning point, as represented by a NO at step 305, the routine goes to step 313, where the N-value is reduced by one to provide N-value =N1. Then the routine goes to the next decision step 314. It is determined at step 314 whether or not N1 is a tuning point in the LOCAL condition. If N1 is then a tuning point, as represented by a YES at step 314, the routine goes to step 311, where the receiving sensitivity is switched to the DX condition. Then the routine goes to step 312, where N-value =N1 is determined to be the correct tuning point. This tuning operation is performed in case [5]in FIG. 9.

If it is determined at decision step 314 that N-value =N1 is not a tuning point, the routine goes to step 315, where the N-value is advanced by two steps to provide N-value =N3. Then the routine goes to the next decision step 316. It is determined at decision step 316 whether or not N3 is a tuning point. If N3 is a tuning point, as represented by a YES at step 316, the routine goes to step 311, in which the receiving sensitivity is switched to the DX condition. Then the routine goes to step 312, where the N-value =N3 is identified as the correct tuning point. This tuning operation is performed in case [6]in FIG. 9.

If on the other hand it is determined that N-value =N3 is not a tuning point, as represented by a NO at step 316, the routine goes to step 317, where the N-value is reduced by two steps to provide N-value =N1. Then the routine goes to step 311, where the receiving sensitivity is switched to the DX condition. Then, at step 312, N-value =N1 is determined to be the correct tuning point. This tuning operation is performed in case [7]in FIG. 9.

While the receiving sensitivity is switched in the antenna tuning circuit 11 in the embodiment described above, it is possible to provide means for changing the total gain of the system from the antenna tuning circuit 11 to the intermediate frequency amplifying circuit 15 at a proper position of this system. Alternatively, or in addition, the detection threshold level of the level comparing circuit 18 may be varied to produce a similar action and effect.

According to the present invention, as described above, when the correct tuning point is discriminated from the plurality of detected tuning points, the receiving sensitivity is switched or the signal intensity detection level of the tuning point is switched and the scanned result before or after the above-mentioned switching operation is utilized. Thus, regardless of whether the number of tuning points is odd or even, it is possible to determine the correct tuning point precisely.

Therefore, a symmetrical property of the filter characteristic, which is required by conventional automatic tuning apparatus, is not required in accordance with the invention, thus making it possible to make the receiving apparatus compact and inexpensive.

Since most conventional receiving units are provided with a receiving sensitivity switching function, the auto tuning apparatus of the present invention can be incorporated therein without extensively modifying the structure thereof.

The description set out above is presented by way of example with respect to a single preferred embodiment of the invention, and it is apparent that many modifications and variations thereof can be effected by one having ordinary skill in the art without departing from the spirit and scope of the novel concepts of the invention. Accordingly, the scope of the invention should be determined only by the appended claims.

I claim:

1. Auto tuning apparatus for automatically determining a correct tuning point of an intermediate frequency carrier of a received signal, said apparatus comprising:
a local oscillating circuit for adjusting the IF carrier of the received signal having a phase locked loop configuration and including a variable frequency-dividing circuit having a frequency dividing ratio 1/N, where N is a positive integer, and means for sequentially varying the value of N;
detecting means for detecting a plurality of tuning points of said intermediate frequency carrier;
scanning means responsive to said detecting means for carrying out a scan of said plurality of tuning points by varying a tuning detecting threshold value relative to a level of said received signal;

means responsive to said scanning means for determining said correct tuning points and causing the sequential variance of N; and sensitivity adjusting means responsive to said detecting means for adjusting the signal level of said received signal when a number of said plurality of tuning points is detected.

2. Auto tuning apparatus according to claim 1, further comprising a read only memory for supplying successive values of N to said variable frequency-dividing circuit.

3. Auto tuning apparatus according to claim 1, wherein said local oscillating circuit further includes a voltage controlled oscillator and pre-scaler responsive to said voltage-controlled oscillator for dividing an output thereof by a constant to generate a signal for division by said variable divider.

4. Auto tuning apparatus for automatically determining a correct tuning point of an intermediate frequency carrier of a received signal, said apparatus comprising:

a local oscillating circuit for adjusting the IF carrier of the received signal having a phase locked loop configuration and including a variable frequency-dividing circuit having a frequency dividing ratio 1/N, where N is a positive integer, and means for sequentially varying the value of N;

detecting means for detecting a plurality of tuning points of said intermediate frequency carrier;

scanning means responsive to said detecting means for carrying out a scan of said plurality of tuning points;

sensitivity adjusting means connected to said detecting means for adjusting the level of the received signal in response to the detection of the plurality of tuning points; and means responsive to said scanning means and said sensitivity adjusting means for determining said correct tuning point and causing the sequential variance of N.

* * * * *

UNITED STATES PATENT AND TRADEMARK OFFICE
CERTIFICATE OF CORRECTION

PATENT NO.   :   4,919,640
DATED        :   April 24, 1990
INVENTOR(S)  :   Masami Yanagibori It is certified that error appears in the above-identified patent and that said Letters Patent is hereby corrected as shown below:

Col. 4, line 27, change "irciut" to --circuit--

Col. 6, line 51, change "on" to --one--

Col. 8, line 49, after "213" insert --.--

Col. 9, line 41, after "309" insert --;--

Col. 10, line 67, after "tuning" insert --point--

Col. 11, line 2, change "points" to --point--

Signed and Sealed this

Seventeenth Day of September, 1991

Attest:

HARRY F. MANBECK, JR.

*Attesting Officer*    *Commissioner of Patents and Trademarks*